United States Patent [19]

Yamazaki

[11] Patent Number: 5,714,778
[45] Date of Patent: Feb. 3, 1998

[54] SEMICONDUCTOR DEVICE INCLUDING MEMORY CELL HAVING A CAPACITANCE ELEMENT ADDED TO A NODE OF THE CELL

[75] Inventor: Toru Yamazaki, Tokyo, Japan

[73] Assignee: NEC Corporation, Japan

[21] Appl. No.: 552,390

[22] Filed: Nov. 3, 1995

[30] Foreign Application Priority Data

Nov. 11, 1994 [JP] Japan .................. 6-277459

[51] Int. Cl.⁶ .................................................. H01L 27/11
[52] U.S. Cl. .................. 257/298; 257/903; 257/622; 257/773
[58] Field of Search ...................... 257/915, 296, 257/298, 300, 903, 904, 659, 660, 622, 773, 774, 776

[56] References Cited

U.S. PATENT DOCUMENTS

| 5,350,933 | 9/1994 | Yoshihara | 257/903 |
| 5,352,916 | 10/1994 | Kiyono et al. | 257/903 |
| 5,426,324 | 6/1995 | Rajeevakumar | 257/903 |
| 5,438,537 | 8/1995 | Sasaki | 257/903 |

FOREIGN PATENT DOCUMENTS

| 59-23559 | 2/1984 | Japan . | |
| 60-189253 | 9/1985 | Japan . | |
| 60-261167 | 12/1985 | Japan . | |
| 61-283161 | 12/1986 | Japan . | |
| 62-219559 | 9/1987 | Japan . | |
| 1-273348 | 11/1989 | Japan . | |
| 4-84458 | 3/1992 | Japan . | |
| 0291959 | 10/1992 | Japan | 257/903 |

OTHER PUBLICATIONS

"Center Wordline Cell: A New Symmetric Layout Cell for 64Mb SRAM" Naiki et al; 1993; IEEE, pp. 817–820.

Primary Examiner—Wael Fahmy
Assistant Examiner—David B. Hardy
Attorney, Agent, or Firm—Hayes, Soloway, Hennessey, Grossman & Hage, P.C.

[57] ABSTRACT

The invention provides a semiconductor device of improved reliability wherein a memory cell can accumulate a sufficient amount of charge and written information in a flip-flop can be reproduced with certainty and a method of producing the semiconductor device. According to the present invention, grounding line 15 is used for one of electrodes for a capacitance element, and a polycrystalline silicon layer which is the other capacitor electrode 16 is provided just above grounding line 15. By the construction, the area of the capacitor electrode is increased on a memory cell.

9 Claims, 9 Drawing Sheets

1
SEMICONDUCTOR DEVICE INCLUDING MEMORY CELL HAVING A CAPACITANCE ELEMENT ADDED TO A NODE OF THE CELL

BACKGROUND OF THE INVENTION

1. Field of the Invention

This invention relates to a semiconductor device, and more particularly to a static random access memory device which is high in integration, very low in power dissipation and high in soft error resistance and a method of producing the same.

2. Description of the Related Art

Figure 6:
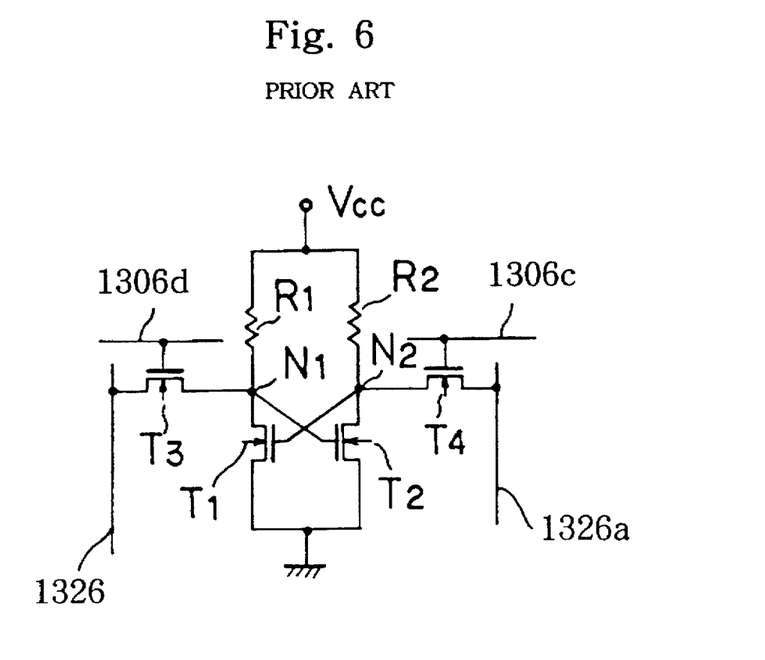
FIG. 6 is an equivalent circuit diagram of an SRAM memory cell.

FIG. 6 is an equivalent circuit diagram showing a construction of a conventional high integration static random access memory cell (hereinafter referred to as SRAM) in which a MOS transistor is employed.

The SRAM includes a flip-flop circuit including two driving MOS transistors T1 and T2 connected in cross connection, two high resistance elements R1 and R2 connected to two storage nodes N1 and N2 of the flip-flop circuit for supplying small currents to storage nodes N1 and N2 to maintain information, respectively, and transfer MOS transistors T3 and T4 connected to storage nodes N1 and N2 for writing and reading out information, respectively. Power source voltage Vcc and a ground potential are supplied to the flip-flop circuit, and data lines 1326 and 1326a are connected to transfer MOS transistors T3 and T4 while the gates of transfer MOS transistors T3 and T4 are connected to word lines 1306c and 1306d, respectively.

In operation of the SRAM constructed as described above, as well known in the art, the word lines are activated to store information of "High" or "Low" from the data lines into storage nodes N1 and N2 by way of transfer MOS transistors T3 and T4 or conversely to read out the states of storage nodes N1 and N2, respectively.

Also with the SRAM described above, improvement in integration and reduction in power dissipation are normally significant achievements to be sought. With an SRAM cell, both can be achieved at the some time by reducing the dimensions of circuit elements and by increasing the value of the load resistance. However, as reduction in the dimensions of circuit elements proceeds, although the degree of integration is improved, the area of the pn junctions at the node portions of the flip-flop decreases and also the floating capacitance decreases inevitably. Consequently, if the load resistance is increased simply in this condition, the node potentials become unstable, which increases the liability to malfunction from so-called α-ray soft error.

An α-ray is produced when uranium (U) or thorium (Th) contained in a very small amount in a material such as resin used for encapsulation of a memory chip or wiring material such as aluminum decays. If the α-ray is introduced into a storage node portion in a memory cell which is in a "High" state, then an electrode-hole pair is produced along a range of the α-ray, and the electron is attracted to the storage node by an electric field in a depletion layer and causes the potential of the storage node to fluctuate. If the potential fluctuation has a sufficient value to invert the flip-flop, then the information in the memory is destroyed. This phenomenon is called soft error.

Figure 1:
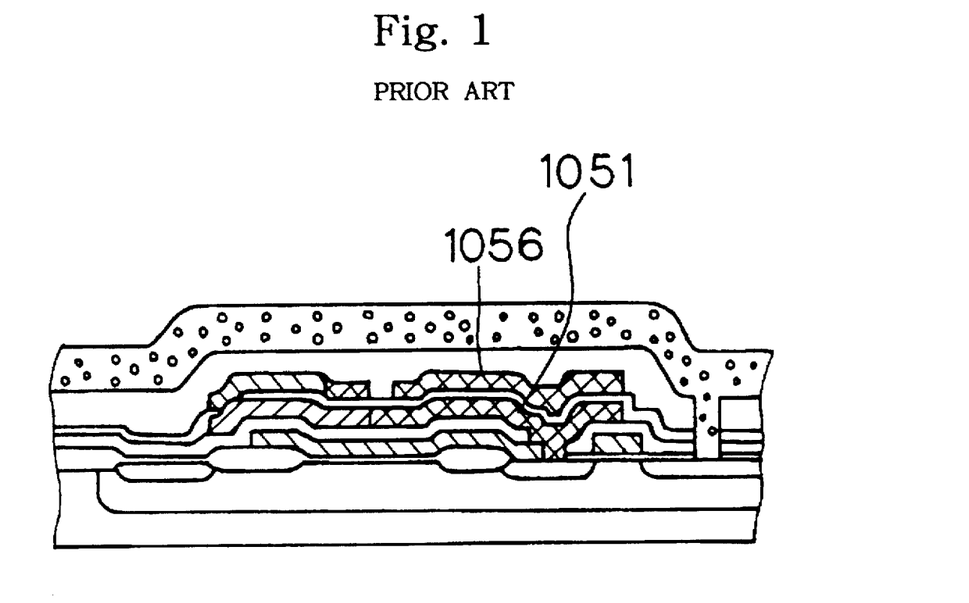
FIG. 1 is a sectional view of a conventional example.
Figure 2:
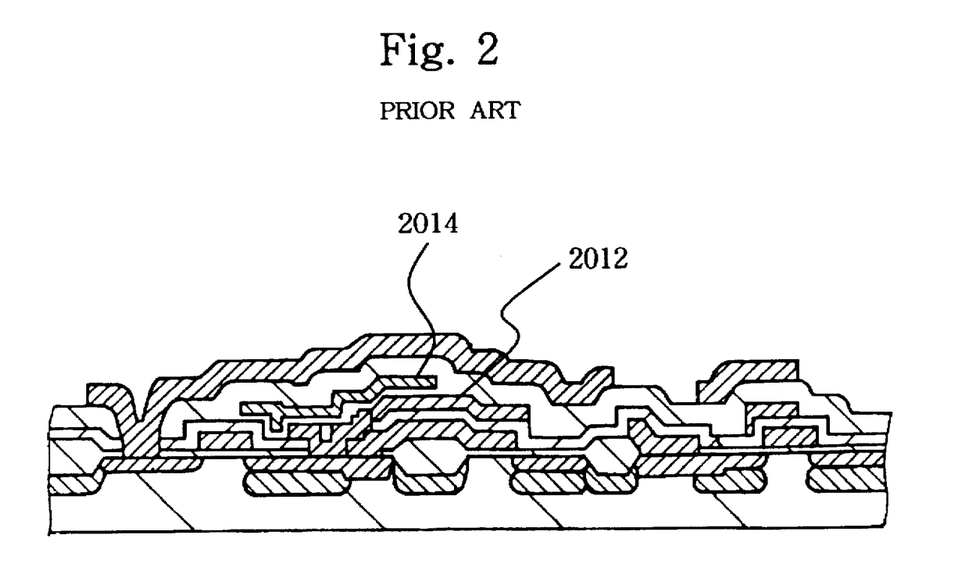
FIG. 2 is a sectional view of another conventional example.

Conventionally, various proposals have been made as a countermeasure for the soft error phenomenon described above. For example, Japanese Patent Laid-Open Application No. Showa 61-283161 (JP.A 283161/86) and Japanese Patent Laid-Open Application No. Showa 62-219559 (JP.A 219559/87) disclose different methods for increasing the capacitance of a node portion, wherein, as shown in FIGS. 1 and 2, a capacitance element is formed between conductive layer 1051 or 2012 formed from a polycrystalline silicon film of a second layer and conductive layer 1056 or 2014 provided on conductive layer 1051 or 2012, respectively. The polycrystalline silicon film of the second layer is simultaneously used as a load resistor to the memory cell.

However, with any of the methods described above, since the polycrystalline silicon layer which is the same layer as the resistor element is used for one of electrodes of the capacitance element, the area of the capacitor electrode cannot be formed very large on the memory cell, and also the amount of accumulated charge of the node portion cannot be increased very much.

Further, since information destruction in the memory cell is caused by a potential fluctuation of the "High" node portion, the memory cell exhibits a higher α-ray resistance where the capacitance element to be added to the node portion is provided not between the node and the power source potential (VCC) but between the node and the ground potential.

Figure 3:
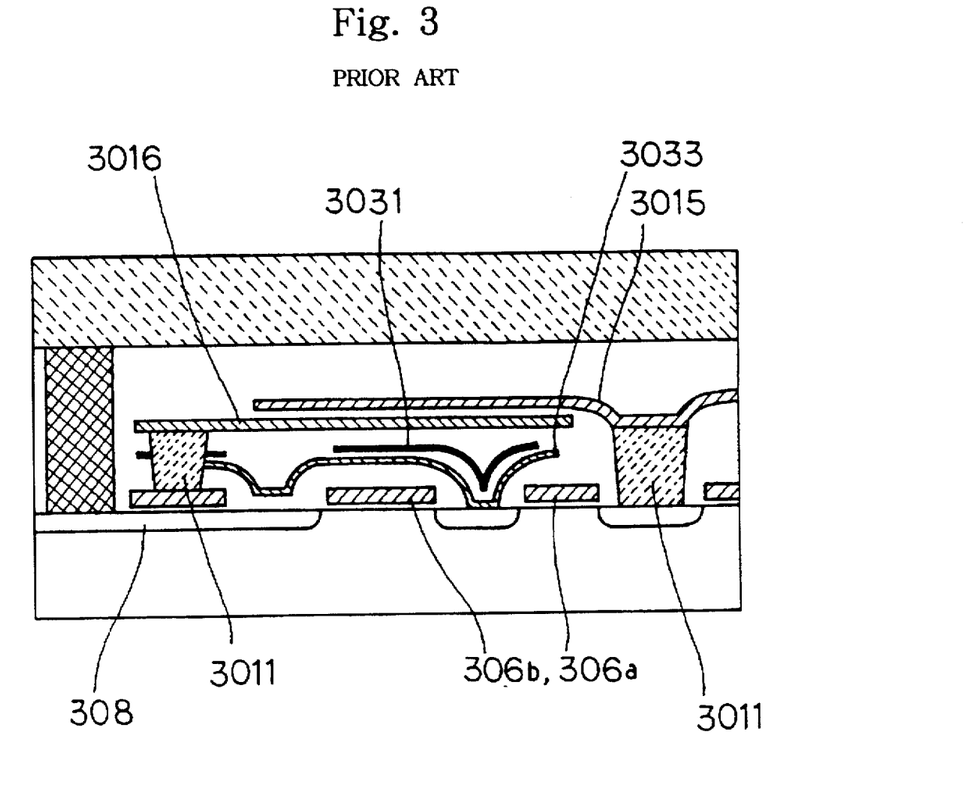
FIG. 3 is a sectional view of a further conventional example.

The structure of a capacitor added to a node portion shown in FIG. 3 is disclosed in I. Naiki et al., IEDM Technical Digest, 1993, pp. 817–820.

In the conventional examples just mentioned, an additional capacitor is formed between grounding line 3015 and capacitor lower electrode 3016, and can have a higher capacitance value than a capacitance element formed between a wiring layer of a resistance element and another wiring layer provided on the wiring layer described above. However, the capacitor structure has the following problems. It is to be noted that, in order to raise the current driving capacity for the load element to further increase the α-ray resistance, in the capacitor structure, a p-channel TFT (thin film transistor) is used for the load element.

The first problem resides in that, as can be seen from the sectional structure shown in FIG. 3, since the capacitance element is formed after a p-channel TFT including n-type diffusion layer 308, gates 306a and 306b, TFT gate electrode 3033 and TFT channel portion 3031 are formed, heat treatment at the step at which the capacitance element is formed (deposition of a wiring layer and an interlayer film and formation of a capacitor insulating film) is applied also to the TFT, resulting in deterioration in TFT performance characteristics such as increase in short channel effect or increase in interfacial state between a polycrystalline silicon channel portion and a TFT gate oxide film.

Further, the TFT is liable to be influenced by plasma damage by dry etching which is performed for formation of a polycrystalline silicon plug or for working of a capacitor electrode, resulting in variation of threshold voltage or increase of sub threshold coefficient. Accordingly, it is desirable to form the TFT after formation of the capacitor but before formation of a metal wiring line. Further, in the capacitor structure, since capacitor lower electrode 3016 is overlapped with an upper electrode, the time zero breakdown voltage of the capacitor insulating film is liable to be deteriorated at corner portions at which they are overlapped with each other.

Further, upon formation of a connection hole for connection between grounding line 3015 and a substrate after formation of the capacitor insulating film, since a photo resist mask contacts directly with the capacitor insulating film, the time zero breakdown voltage of the capacitor insulating film is liable to be deteriorated. This deterioration is a phenomenon similar to a phenomenon of deterioration of the time zero breakdown voltage of a gate oxide film well known in the art which occurs when a photo resist step is performed after formation of the gate oxide film.

Figure 4:
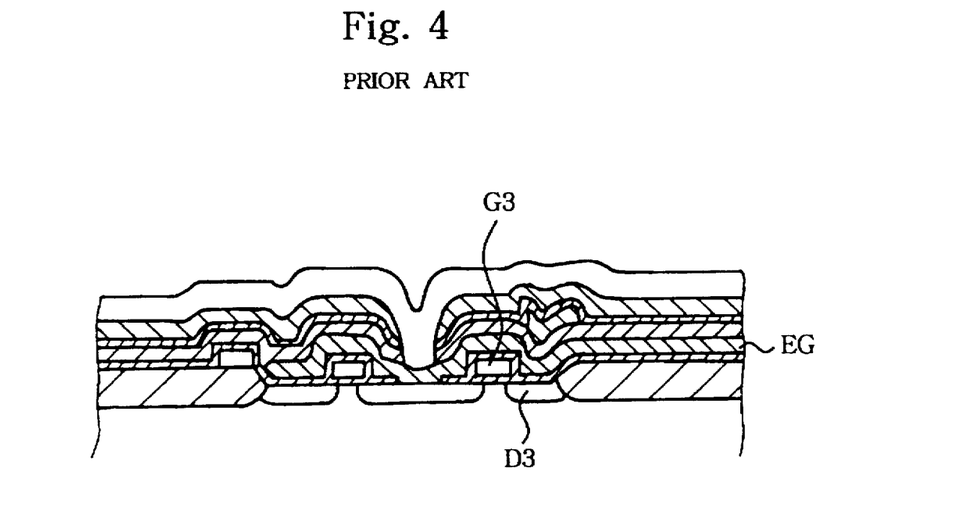
FIG. 4 is a sectional view of a still further conventional example.

It is to be noted that a capacitance element of structure shown in FIG. 4 is disclosed in Japanese Patent Laid-Open Application No. Showa 60-189253 (JP.A 189253/85).

This conventional example employs a method wherein a node capacitor is formed between grounding electrode layer EG and an upper face and a side face of gate electrode G3 and drain region D3 of an NMOS transistor. With this method, it is difficult to assure a sufficient capacitance value as the memory cell size decreases.

Figure 5:
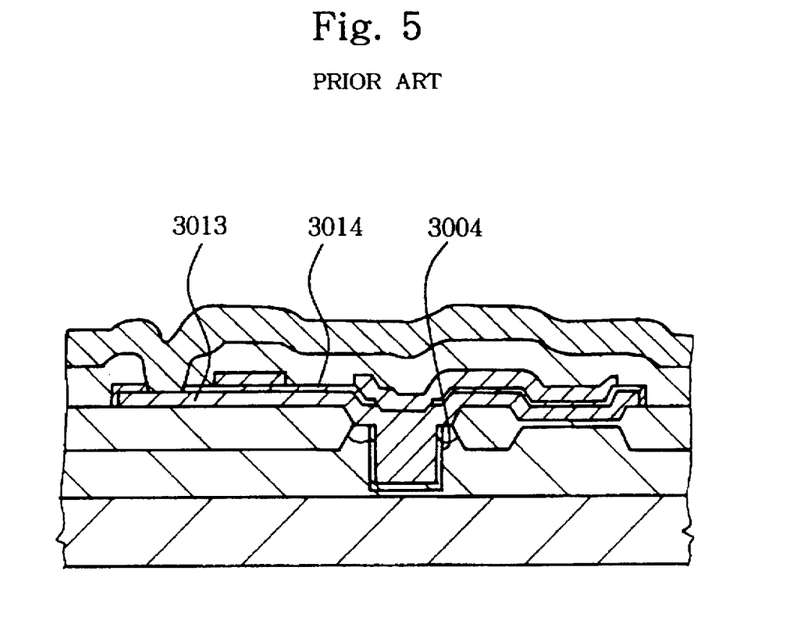
FIG. 5 is a sectional view of a yet further conventional example.

Further, Japanese Patent Laid-Open Application No. Showa 60-261167 (JP.A 261167/85) proposes a method wherein, as shown in FIG. 5, trench groove 3004 in the form of a trench-like fine hole is formed on a substrate, and at least the portions of conductive layers 3013 and 3014 which form a gate electrode extend into the inside of trench groove 3004 to form a node capacitor.

With the structure just described, although the capacitance value can be increased by increasing the depth of trench groove 3004, since one of electrodes for the added capacitance element is a trench plane formed in the substrate, if an α-ray is introduced into a storage node portion in the memory cell which is in a "High" state, those electrons from among the electron-hole pairs produced in the substrate along the range of the α-ray which are attracted to the storage node by an electric field in the depletion layer increase in amount, and little of the effect which is provided by the addition of the trench capacitor is exhibited. As a result, the potential at the storage node fluctuates, and information in the flip-flop may possibly be inverted. Accordingly, it is not preferable to form an additional capacitor for a node portion in the inside of a substrate.

Of the prior art described above, the prior art disclosed in Japanese Patent Laid-Open Application No. Showa 61-283161 (JP.A 283161/86) and Japanese Patent Laid-Open Application NO. Showa 62-219559 (JP.A 219559/87) and shown in FIGS. 1 and 2, respectively, has the problem that a capacitor electrode of large area cannot be formed and also a node portion cannot have a great amount of accumulated charge.

The prior art shown in FIG. 3 has another problem in that, since a capacitance element is formed after a TFT is formed, the characteristic of the TFT formed before is deteriorated by heat treatment performed upon formation of the capacitance element.

The prior art has another problem in that the time zero breakdown voltage of a capacitor insulating film is reduced or the reliability is deteriorated at corner portions of the capacitance element at which a lower electrode and an upper electrode of the capacitance element are overlapped with each other.

In connection with the capacitor insulating film, the prior art has a further problem in that, since a photoresist mask contacts directly with the capacitor insulating film upon formation of a connection hole for connection between a grounding wiring line and a substrate, this also makes it liable to cause deterioration of the time zero breakdown voltage.

The prior art disclosed in Japanese Patent Laid-Open Application No. Showa 60-189253 (JP.A 189253/85) and shown in FIG. 4 has the problem that it is difficult to assure a sufficient capacitance value as the memory cell size decreases.

The prior art disclosed in Japanese Patent Laid-Open Application No. Showa 60-261167 (JP.A 261167/85) and shown in FIG. 5 has the problem that the potential at the storage node fluctuates to such a degree that flip-flop information may possibly be inverted.

SUMMARY OF THE INVENTION

The present invention has been made in view of the various problems of the prior arts described above, and it is an object of the present invention to provide a semiconductor device of improved reliability wherein a memory cell can accumulate a sufficient amount of charge and written information in a flip-flop can be reproduced with certainty and a method of producing the semiconductor device.

According to an aspect of the present invention, there is provided a semiconductor device which includes a flip-flop circuit including a pair of driving MOS transistors provided in a memory cell region on a semiconductor substrate, a switch element provided for each of two input and output portions of the flip-flop circuits, and a capacitance element provided on the memory cell region and connected to drain regions of the driving MOS transistors of the flip-flop circuit, characterized in that the flip-flop circuit includes two series circuits each including a resistance element and one of the driving MOS transistors and connected in cross connection, the capacitance element on the memory cell area includes a dielectric film provided on a conductive layer which is an electrode for supplying a ground potential to source regions of the MOS transistors, and an additional conductive layer provided on the dielectric layer, and ends of the resistance elements are connected in a self-conforming condition to gate electrodes of the MOS transistors through connection holes which extend through a conductive layer for supplying the ground potential, the dielectric layer and the additional conductive layer, and are also connected to the additional conductive layer.

In this instance, the resistance elements may be replaced by MOS transistors formed from a polycrystalline silicon layer.

Further, the insides of connection holes for connecting the MOS transistors formed from the polycrystalline silicon layer and the gate electrodes of the MOS transistors may be filled up with a titanium nitride film.

According to another aspect of the present invention, there is provided a method of producing a semiconductor device which includes a flip-flop circuit including a pair of driving MOS transistors provided in a memory cell region on a semiconductor substrate, a switch element provided for each of two input and output portions of the flip-flop circuits, and a capacitance element provided on the memory cell region and connected to drain regions of the driving MOS transistors of the flip-flop circuit, characterized in that it comprises:

the first step of patterning a first conductive layer to form gate electrodes of a pair of driving MOS transistors;

the second step of forming an insulating film over an overall area including the area of the gate electrode;

the third step of forming a second conductive layer connecting to source regions of the driving MOS transistors and successively forming a dielectric film and a third conductive layer on the second conductive layer;

the fourth step of successively etching the third conductive layer, the dielectric film and the second conductive layer to pattern them;

the fifth step of patterning the third conductive layer;

the sixth step of forming an insulating film over an overall area including the third conductive layer;

the seventh step of forming contact holes extending through the third conductive layer, the dielectric film and the second conductive layer;

the eighth step of forming an insulating film over an overall area including the contact holes; and the ninth step of etching a portion of the third conductive layer and the insulating film in the insides of the contact holes to remove the insulating film at a portion of the third conductive layer while leaving the insulating film on side walls in the insides of the contact holes.

In this instance, the insulating film formed over the overall area including the contact holes at the eighth step contains 4 to 9 percent phosphorous by molar weight.

In the present invention, since one of the electrodes of the capacitance element is a capacitance electrode including a dielectric film provided on a grounding line disposed in such a manner as to completely cover the driving MOS transistors in the memory cell, the capacitor area on the memory cell can be made large, and also the amount of accumulated charge of the node portions can be made large.

Further, since the capacitance element is provided between the nodes and the ground potential, it is high in α-ray resistance.

Furthermore, also where a MOS transistor (for example, a TFT) is used for a load element, since the TFT is formed after the capacitance element is formed, the transistor is not influenced by a heat treatment step (deposition of a wiring layer and an interlayer film, formation of a capacitor insulating film) or by plasma damage from drying etching for formation of the capacitance element.

Thus, in the present invention, information written in the memory cell is prevented from being inverted by minority carriers produced in the semiconductor substrate, and a reduction in the amount of accumulated charge caused by a drop of the drain potential upon reading or writing is compensated for by the capacitance element on the memory cell region. Consequently, information of the SRAM is improved in reliability.

DETAILED DESCRIPTION OF THE PREFERRED EMBODIMENTS

The present invention is described below with reference to the drawings.

Figure 7:
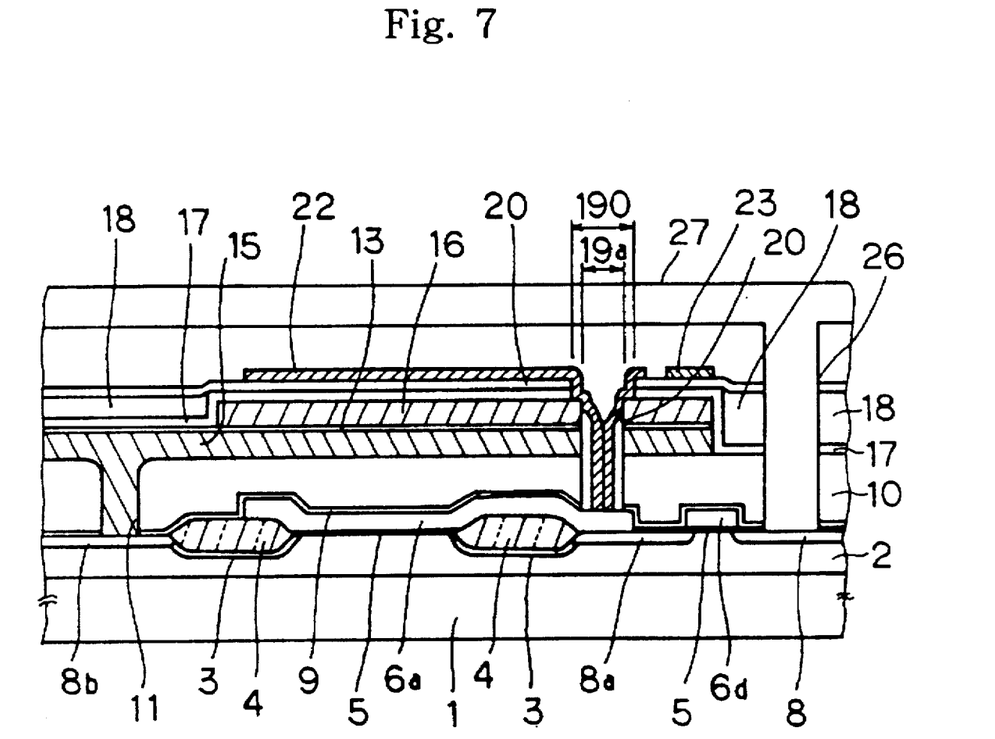
FIG. 7 is a sectional view of a first embodiment of the present invention.
Figure 8:
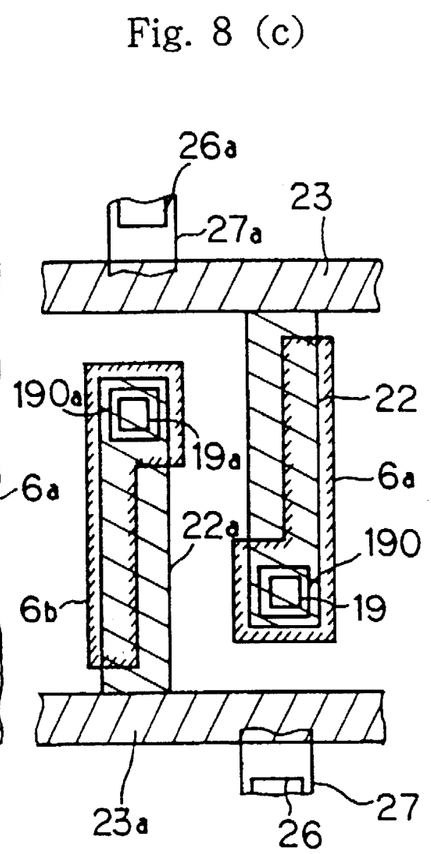
FIGS. 8(a) to 8(c) are plan views of the first embodiment of the present invention.

FIG. 7 and FIGS. 8(a) to 8(c) are a sectional view and plan views showing a construction of an embodiment of the present invention, and wherein FIG. 7 is a sectional view taken along line A—A of FIG. 8(a), and FIGS. 8(a) to 8(c) are figures showing the same portion. However, since several elements are overlapped with each other, the same portion is shown divisionally in FIGS. 8(a) to 8(c).

The present embodiment is a memory cell including two high resistance elements and has a basic construction similar to the construction of the SRAM shown in the equivalent circuit diagram of FIG. 6 which employs a MOS transistor.

Referring to FIGS. 8(a) to 8(c), gate electrodes 6a and 6b correspond to the gate electrodes of driving MOS transistors T1 and T2 shown in FIG. 6, respectively, and gate electrodes 6c and 6d correspond to the gate electrodes of transfer MOS transistors T3 and T4 shown in FIG. 6, respectively. With regard to the other components shown in the equivalent circuit diagram of FIG. 6, the drain of driving MOS transistor T1 and the high concentration n-type impurity region of transfer MOS transistor T3 are provided commonly as n-type impurity region 8d. Further, the drain of driving MOS transistor T2 and the high concentration n-type impurity region of transfer MOS transistor T4 are provided commonly as n-type impurity region 8a. Meanwhile, gate electrode 6a of driving. MOS transistor T1 is electrically connected, at the location of connection hole 7a, to high concentration n-type impurity region 8a which serves as the drain of transfer MOS transistor T4. Further, gate electrode 6b of driving MOS transistor T2 is electrically connected, at the location of connection hole 7b, to high concentration n-type impurity region 8d which serves as the drain of transfer MOS transistor T3, thereby achieving the cross connection of the flip-flop circuit of the SRAM memory.

In the present embodiment, connection holes 11 and 11a are opened in high concentration n-type impurity regions 8b and 8c which serve as the sources of driving MOS transistors T1 and T2, respectively, and high concentration n-type impurity regions 8b and 8c are electrically connected to grounding line 15 which is a conductor film of a second layer for supplying the ground potential. For this grounding line 15, a polycrystalline silicon film in which an n-type impurity is diffused, a composite film (polycide film) of a polycrystalline silicon film and a high melting point silicide film or a like film is used in order to prevent the ground potential from being raised by current flowing through the memory cell.

Further, referring to the sectional view of FIG. 7, upper electrode 16 of a capacitance element which is connected to a node portion of the memory cell by way of dielectric film 13 such as an oxide film or a nitride film is provided on grounding line 15. Upper electrode 16 of the capacitance element is indicated, in the plan view of FIG. 8(b), in addition to reference numeral 16, also by reference character 16a, and corresponds, in the equivalent circuit diagram of FIG. 6, to the upper electrode of the capacitance element connected to storage nodes N1 and N2.

In the SRAM of the present embodiment, connection hole 19a is opened to gate electrode 6a as shown in the sectional view of FIG. 7, and high resistance load element 22 formed from a high resistance polycrystalline silicon film of a fourth layer is connected to gate electrode 6a through connection hole 19a. Connection hole 19a is provided through grounding line 15, and side wall 20 of an insulating film is formed on an inner wall of connection hole 19a so that, when an end portion of high resistance load element 22 and gate electrode 6a of the first layer are connected to each other through connection hole 19a, they may not be short-circuited to grounding line 15. Further, upper electrode 16 of the third layer and high resistance load element 22 of the fourth layer are connected to each other through connection hole 190 provided on the outer side of connection hole 19a. Furthermore, power source wiring line 23 is formed from a low resistance polycrystalline silicon film for feeding a power source voltage to the high resistance polycrystalline silicon. Further, aluminum electrode wiring line 27 is a data line in the memory cell and is electrically connected to high concentration n-type impurity region 8 of the transfer MOS transistor through contact hole 26. The structure described above similarly applies to gate electrode 6b, connection holes 19a and 190a, high resistance polycrystalline silicon film 22a and power source line 23a in the plan views of FIGS. 8(a) to 8(c).

Next, a production method of the present embodiment is described with reference to the drawings.

Each of FIGS. 9(a) to 9(d) and 9(e) to 9(h) is a view showing a production step of the SRAM cell wherein a polycrystalline silicon high resistance element is employed as a load element based on the embodiment shown in FIG. 7, and indicates a section taken along line A—A of the plan view of FIG. 8(a).

In the present embodiment, the MOS transistor used in the memory cell and formed on the surface of the semiconductor substrate is an n-channel MOS transistor in a p-type well and a complementary MOS (CMOS) circuit which includes double wells is used as a memory peripheral circuit. However, the CMOS circuit may have a single structure of a p-type well or an n-type well or may have a well structure of three or more wells wherein a well of the same conductive type as a substrate is surrounded by another well of a different conductivity type and electrically isolated from the substrate so that a plurality of power source voltages may be supplied to the memory peripheral circuit.

Further, the conductivity type of the silicon substrate also may be an n type or a p type. Furthermore, while, in the present embodiment, only the process of production of the memory cell portion is described, a known technique can be used for the method of producing the peripheral CMOS circuit.

Figure 9:
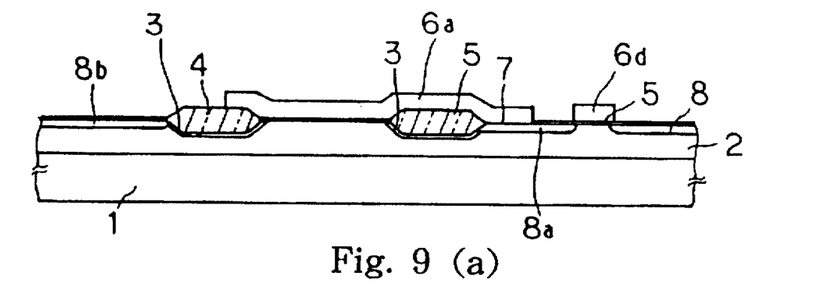
FIGS. 9(a) to 9(h) are sectional views illustrating a method of producing the first embodiment of the present invention.

First, using known methods of boron ion implantation and thermal diffusion, p-type well 2 of impurity concentration of $10^{16}$ to $10^{17}$ cm$^{-3}$ and depth of 2 to 3 μm is formed in n-type silicon substrate 1. Then, using ion implantation and selective oxidation, channel stopper layer 3 and field oxide film 4 for element isolation of thickness of 300 to 500 nm are formed. Thereafter, gate oxide film 5 of thickness of 5 to 15 nm is formed at a portion which is to make an active area of the MOS transistor.

Then, ion implantation for adjustment of threshold voltage of the MOS transistor is performed, and using photo-etching, gate oxide film 5 is removed partially to form connection holes 7a and 7b. Thereafter, polycrystalline silicon film 6 of thickness of 200 nm is deposited using a known method, and an n-type impurity such as phosphorous is introduced into polycrystalline silicon film 6 using vapor phase diffusion or ion implantation. Then, polycrystalline silicon film 6 described above is patterned by photolithography and dry etching to form gate electrodes 6a and 6d. It is to be noted that the polycrystalline silicon film described above may be replaced by a polycide film which is a composite film of a metal silicide film and a polycrystalline silicon film.

Thereafter, using gate electrodes 6a and 6d as a mask for ion implantation, ions of an n-type impurity such as arsenic are implanted by ion implantation in an amount of $10^{15}$ to $10^{16}$ cm$^{-2}$, and then annealing is performed in a nitrogen atmosphere around 900° C. to form n-type impurity regions 8, 8a and 8b.

By the steps described above, the structure shown in the sectional view of FIG. 9(a) is formed. It is to be noted that, while, in the present embodiment, the source-drain structure of the MOS transistor shown is a single drain structure, it may alternatively be an LDD (lightly Doped Drain) structure.

Then, oxide film 9 of thickness of 50 to 100 nm is deposited using known CVD, and then borosilicate glass (BPSG) 10 of thickness of 100 to 200 nm is deposited using known CVD. Thereafter, annealing is performed in a nitrogen atmosphere approximately at 850° C. to flatten the surface of oxide film 9. Then, connection hole 11 is opened in borosilicate glass 10 and oxide film 9 using photolithography and dry etching, and polycrystalline silicon film 12 of the second layer of thickness of 100 to 150 nm is deposited. Then, an n-type impurity such as arsenic is introduced by an implantation in an amount of $10^{15}$ to $10^{16}$ cm$^{-2}$ using ion implantation or the like, and dielectric film 13 is deposited using known CVD.

For dielectric film 13, for example, an oxide film, a nitride film, and an insulator film such as a tantalum oxide film can be used. Thereafter, third polycrystalline silicon film 14 is deposited to thickness of 100 to 150 nm using known CVD, and an n-type impurity such as arsenic is introduced by an implantation in an amount of $10^{15}$ to $10^{16}$ cm$^{-2}$ using ion implantation or the like. The introduction of an n-time impurity into second and third polycrystalline silicon films 12 and 14 may be performed during deposition. Further, for second and third polycrystalline silicon films 12 and 14, a material of a low resistance such as a metal silicide film such as tungsten silicide or a polycide film can be used. By the steps described above, the structure shown in the sectional view of FIG. 9(b) is formed.

Then, third polycrystalline silicon film 14, dielectric film 13 and second polycrystalline silicon film 12 described above are successively etched using photo-lithography and dry etching to pattern them into the shape of grounding line 15 as shown in the sectional view of FIG. 9(c). Thereafter, third polycrystalline silicon film 14 is patterned using photo-lithography and dry etching to form upper electrode 16 of a capacitance element as shown in FIG. 9(d). It is to be noted that, if an additional processing step for causing thermal oxidation on side faces of thus etched grounding line 15 and capacitor upper electrode 16 is performed next to form an oxide film of the thickness of 5 to 10 nm, the insulator time zero breakdown voltage of the capacitance element can be improved (not shown in the drawings).

Then, oxide film 17 is deposited to thickness of 50 to 100 nm using known CVD to fill up a space portion between grounding lines 15 and another space portion between upper electrodes 16 of the capacitance element to flatten the surface including capacitor upper electrode 16. It is to be noted that, when the filling up of the space portions is insufficient using only oxide film 17, it can be made complete by filling up by silica glass 18 by a known spin-on method in combination with oxide film 17.

Thereafter, oxide film 17, capacitor upper electrode 16, dielectric film 13, grounding line 15, BPSG film 10 and oxide film 9 described above are successively etched using photo-lithography and dry etching to open connection hole 19a. By the steps described above, the structure shown in the sectional view of FIG. 9(e) is formed.

Then, oxide film 20 is deposited to thickness of 100 to 200 nm, and resist mask 35 for formation of a connection hole, whose one side is greater by 0.1 to 0.2 µm than connection hole 19a described above, is disposed on the outer side of connection hole 19a as shown in FIG. 9(f) to pattern connection hole 190 using photo-lithography. Thereafter, using mask 35 described above, oxide films 20 and 17 described above are successively etched using dry etching to form a side wall of oxide film 20 on a side wall of connection hole 19a. Further, in this instance, over-etching is performed to etch an upper portion of oxide film 20 to expose the side face of capacitor upper electrode 16 formed from the third polycrystalline silicon film. Then, fourth polycrystalline silicon film 21 is deposited using known CVD. Polycrystalline silicon film 21 contacts with gate electrode 6a of the driving MOS transistor through connection hole 19a. By the steps described above, the structure shown in the sectional view of FIG. 9(b) is formed.

Then, polycrystalline silicon film 21 described above is patterned using photo-lithography and dry etching to form high resistance load element 22 and power source wiring line 23. Thereafter, a mask for introduction of an impurity, for example, photoresist mask 24, is formed. With photoresist mask 24 which is an impurity introduction mask, high resistance load element 22 is covered while the portion of photoresist mask 24 above power source wiring line 23 is opened.

Then, as shown in the sectional view of FIG. 9(h), an n-type impurity, for example, arsenic, is introduced in an amount of $10^{15}$ to $10^{16}$ cm$^{-2}$ by ion implantation using photoresist mask 24 described above. Thereafter, interlayer insulating film 25 is formed, and annealing is performed in a nitrogen atmosphere around 900° C. to form contact hole 26 and wiring line 27 by a known production method, thereby completing the memory cell of the sectional view of FIG. 7. It is to be noted that, by the annealing around 900° C. and heat treatment in the process after formation of interlayer insulating film 25, the n-type impurity introduced in gate electrode 6a and the n-type impurity introduced in capacitor upper electrode 16 are diffused into an end portion of high resistance load element 22 through connection hole 19a described above so that n-type impurity region 28 is formed.

In the first embodiment of the present invention, since grounding line 15 is used for one of the electrodes of the capacitance element while a polycrystalline silicon layer which is the other capacitor electrode 16 is provided on most of the memory cell in such a manner as to completely cover over gate electrodes 6a and 6b of the driving MOS transistors, the area of the capacitor electrode can be formed large on the memory cell, and also the amount of accumulated charge of the node portion can be increased.

Further, since the capacitance element added to the node portion is provided between the node and the ground potential, it is high in α-ray resistance.

Further, also where a p-channel TFT is used for a load element, since the TFT is formed after the capacitance element is formed, the TFT is not influenced by a heat treatment step (deposition of a wiring layer and an interlayer film, formation of a capacitor insulating film) or by plasma damage from drying etching for formation of the capacitance element. Consequently, deterioration in transistor characteristic such as a variation of threshold voltage or a increase of a sub threshold coefficient which is caused by an increase in leakage arising from short channel effect of a TFT or increase in interfacial state of a TFT gate oxide film.

Furthermore, since the embodiment described above does not have a structure wherein a lower electrode of a capacitance element is overlapped with an upper electrode, it exhibits no deterioration in time zero breakdown voltage of the capacitor insulating film at corner portions at which the upper and lower electrodes are overlapped with each other.

In addition, in the present embodiment, since the grounding line, the capacitor insulating film and the polycrystalline silicon layer for the upper capacitor electrode are formed continuously, a photoresist mask will not contact the capacitor insulating film, and the capacitor insulating film does not suffer from deterioration in time zero breakdown voltage. In this manner, the problems of, the prior art described above can be solved by the present embodiment.

Next, a second embodiment of the present invention is described.

Figure 10:
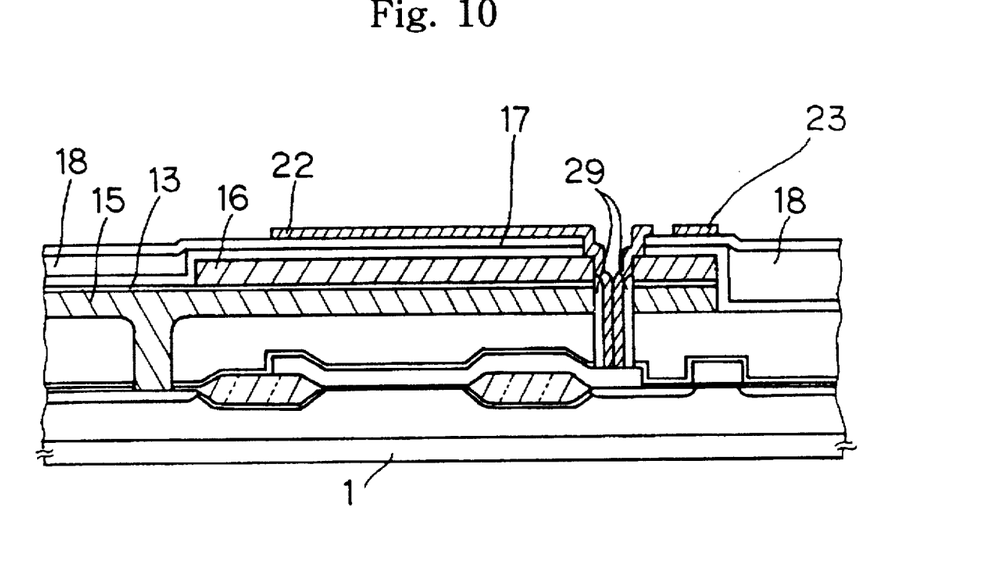
FIG. 10 is a sectional view of a second embodiment of the present invention.

FIG. 10 is a sectional view showing a construction of the second embodiment of the present invention. The present embodiment is different from the first embodiment in that oxide film (PSG) 29 containing phosphorous is used for the side wall insulating film provided in connection hole 19a for connection between high resistance load element 22 and gate electrode 6a of the first wiring layer. Since the other construction is similar to that of the first embodiment shown in FIG. 7, common elements are denoted by the same reference numerals in FIG. 7 and overlapping description is omitted herein.

In the first embodiment, diffusion of an n-type impurity into the end of high resistance load element 22 in connection hole 19a is performed as diffusion of phosphorous from/gate electrode 6a of the first conductive layer by heat treatment in the production process.

However, when lowering of the temperature in heat treatment in the production process proceeds as refinement of transistors proceeds, also the amount of diffused phosphorous decreases, and since the degree of diffusion is different between connection holes for each memory cell, this becomes a cause of dispersion in resistance value between two high resistance elements in the same memory cell. The dispersion in resistance value degrades stability of memory cell operation. Accordingly, where oxide film 29 in the form of a PSG film is provided on the inner wall of connection hole 19a as in the second embodiment, even if the temperature of heat treatment in the production process is lowered, for example, from 900° C. to 850° to 800° C., phosphorous can be diffused from the PSG film uniformly to an end portion of high resistance load element 22, and consequently, the dispersion in resistance value can be reduced.

The production method of the second embodiment can be realized by changing, in the sectional view of FIG. 9(f) illustrating the first embodiment described above, the side wall insulating film formed in the inside of connection hole 19a from oxide film 20 to oxide film 29. Deposition of the PSG film is performed by known low pressure chemical vapor phase deposition (LPCVD), and in this application, the concentration of phosphorous in the PSG film most suitably ranges from 4 to 9 percent by molar weight. Where the concentration of phosphorous is less than 4 percent by molar weight, phosphorous is not diffused sufficiently to an end portion of high resistance load element 22, and the effect of provision of the PSG film is not exhibited. On the other hand, where the concentration of phosphorous is higher than 9 percent by molar weight, phosphorous is diffused in an excessively great amount into high resistance load element 22, and this sometimes decreases the resistance value of high resistance load element 22 suddenly.

Next, a third embodiment of the present invention is described.

In the present embodiment, high resistance load element 22 in the first and second embodiments is replaced by a polycrystalline silicon PMOS transistor.

Figure 11:
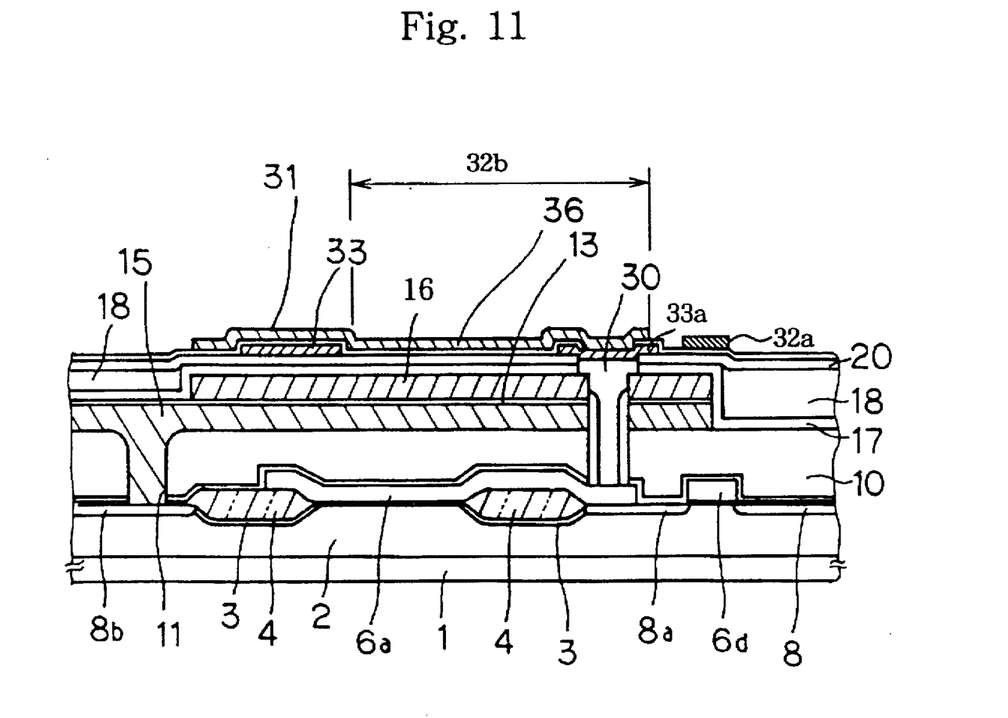
FIG. 11 is a sectional view of a third embodiment of the present invention.
Figure 12:
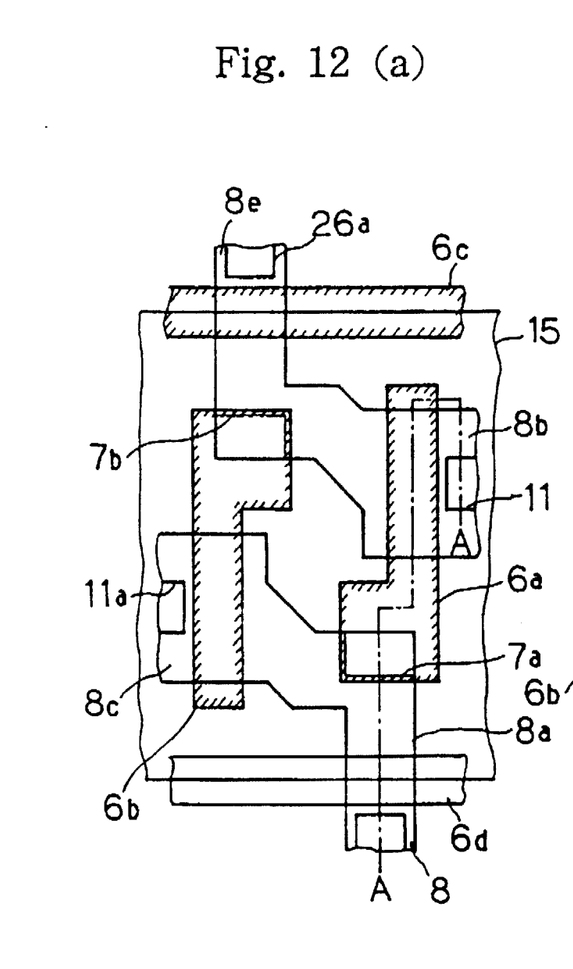
FIGS. 12(a) to 12(c) are plan views of the third embodiment of the present invention.

FIG. 11 and FIGS. 12(a) to 12(c) are a sectional view and plan views of a cell wherein a polycrystalline silicon PMOS transistor is used for a load element for a memory cell which is the second embodiment of the present invention, respectively, and FIG. 11 is a sectional view taken along line A—A of FIG. 12(a).

In the present embodiment, a PMOS transistor including titanium nitride film 30, channel portion polycrystalline silicon film 31, TFT gate 33, TFT gate electrode 33a and TFT gate oxide film 36 is provided on an upper face of the embodiment shown in FIG. 7. Since the other construction is similar to that of the first embodiment shown in FIGS. 7 and 8(a) to 8(c), common elements are denoted by the same reference characters as those of FIGS. 7 and 8(a) to 8(c) and overlapping description is omitted herein.

As described above, the present embodiment employs a p-channel TFT for the load element for the memory cell. The present embodiment is different from the first and second embodiments in that the inside of connection hole 19a is filled up with titanium nitride film 30. Where the structures of the first and second embodiments are employed, a parasitic pn junction is liable to be produced in p-type drain regions 32b and 32c in channel portion polycrystalline silicon film 31 of the p-channel TFT described above by diffusion of an n-type impurity from TFT gate electrodes 33 and 33a, gate electrode 6a and capacitor upper electrode 16. The parasitic pn junction has a bad influence on low voltage operation of the memory cell as lowering of the power source voltage proceeds. Accordingly, it is preferable to minimize formation of a pn junction.

Meanwhile, it is known that the rate of diffusion of an impurity into titanium nitride is much lower than that into polycrystalline silicon. Further, the layer resistance of titanium nitride has such a comparatively low value as, for example, approximately 10 ohms for thickness of 100 nm. Therefore, by filling up connection hole 19a with titanium nitride, the influence of diffusion of an impurity can be solved and besides TFT gate 33 and drain region 32 of the TFT and the node portion of the memory cell can be connected to each other with a comparatively low resistance without producing a parasitic pn junction.

However, since titanium nitride is inclined to be oxidized very readily and oxidation raises the resistance of the film suddenly, sufficient care must be taken so as not to perform processing in an oxidizing atmosphere in the production process after connection hole 19a is filled up with titanium nitride. Further, filling up of connection hole 19a with titanium nitride is performed, for example, by first depositing a titanium nitride film to the thickness of 200 to 150 nm on a substrate by a known CVD technique and then etching back the titanium nitride film by dry etching using gas which contains $CF_4$ type gas as a principal gas.

As described above, the semiconductor device and the production method for the semiconductor device according to the present invention are advantageous, compared with conventional methods wherein a capacitance element is added to a node portion of a memory cell, in that information written in the memory cell is prevented from being inverted by minority carriers produced in the semiconductor substrate, that reduction in amount of accumulated charge caused by a drop of the drain potential upon reading or writing can be compensated for and reliability of the memory cell can be improved.

Where the present invention is used, the capacitance per one node, for example, of a cell having a memory cell area of 10 μm2 can be increased by about 5.4 fF, and as a result, the present invention is advantageous in that the α-ray resistance can be improved by about 1.5 to 2 times.

What is claimed is:

1. A semiconductor device comprising a flip-flop circuit including a pair of driving MOS transistors provided in a region of a memory cell on a semiconductor substrate, a switch element provided for each of two input and output portions of said flip-flop circuits, and a capacitance element structure for being connected to a node of said memory cell, said capacitance element being provided on said memory cell region and connected to drain regions of said driving MOS transistors of said flip-flop circuit, wherein:

said flip-flop circuit includes two series circuits each including a resistance element and one of said driving MOS transistors and connected in cross connection, said capacitance element structure includes a dielectric film provided on a first conductive layer which is an electrode for supplying a ground potential to source regions of said MOS transistors, and a second conductive layer provided on said dielectric layer, such that at least a corner portion of said first conductive layer is clear of said second conductive layer so as to substantially prevent deterioration in a breakdown voltage of said dielectric film at said corner portion, gate electrodes of said driving MOS transistors and said second conductive layer are connected by a third conductive layer making up said resistance elements which extends through connection holes extending through said first conductive layer, said dielectric film, and said second conductive layer, and an oxide film containing phosphorous is disposed on side walls of sad connection holes.

2. A semiconductor device as claimed in claim 1, wherein said resistance elements are replaced by MOS transistors formed from a polycrystalline silicon layer.

3. A semiconductor device as claimed in claim 2, wherein insides of connection holes for connecting said MOS transistors formed from said polycrystalline silicon layer and said gate electrodes of said MOS transistors are filled with a titanium nitride film.

4. A semiconductor device as claimed in claim 1, wherein said second conductive layer completely overlaps the gate electrodes of the driving MOS transistors.

5. A semiconductor device as claimed in claim 1, wherein said oxide film, as deposited on said sidewalls, has a phosphorous concentration of between 4 and 9 percent by molar weight.

6. A semiconductor device comprising a flip-flop circuit including a pair of driving MOS transistors provided in a region of a memory cell on a semiconductor substrate, a switch element provided for each of two input and output portions of said flip-flop circuits, and a capacitance element structure for being connected to a node of said memory cell, said capacitance element being provided on said memory cell region and connected to drain regions of said driving MOS transistors of said flip-flop circuit, wherein said flip-flop circuit includes two series circuits each including a resistance element and one of said driving MOS transistors and connected in cross connection, said capacitance element structure includes a dielectric film provided on a first conductive layer which is an electrode for supplying a group potential to source regions of said MOS transistors, and a second conductive layer provided on said dielectric layer such that at least a corner portion of said first conductive layer is clear of said second conductive layer so as to substantially prevent deterioration in a breakdown voltage of said dielectric film at said corner portion, and gate electrodes of said driving MOS transistors and said second conductive layer are connected by a third conductive layer making up said resistance element which extends through connection holes extending through said first conductive layer, said dielectric film, and said second conductive layer, and an oxide film containing phosphorous is disposed on sidewalls of said connection holes.

7. A semiconductor device as claimed in claim 6, wherein said oxide film is a PSG film.

8. A semiconductor device as claimed in claim 6, wherein said oxide film contacts said resistance elements in said contact holes.

9. A semiconductor device as claimed in claim 8, wherein said oxide film contains concentration of phosphorous sufficient to permit substantially uniform diffusion of phosphorous into said resistance elements whereby to reduce diffusion of resistance value between said resistance elements.

* * * * *

UNITED STATES PATENT AND TRADEMARK OFFICE
CERTIFICATE OF CORRECTION

PATENT NO. : 5,714,778
DATED : February 3, 1998
INVENTOR(S) : Toru Yamazaki It is certified that error appears in the above-identified patent and that said Letters Patent is hereby corrected as shown below:

Claim 1, Col. 12, line 42-43 "side walls" should be --sidewalls--.

Claim 1, Col. 12, line 43, "sad" should be --said--.

Claim 6, Col. 13, line 6, "group" should be --ground--.

Claim 9, Col. 14, line 13-14, "diffusion" should be --dispusion--.

Signed and Sealed this

Eleventh Day of August 1998

Attest:

BRUCE LEHMAN

*Attesting Officer*    *Commissioner of Patents and Trademarks*